(12) United States Patent
Deng et al.

(10) Patent No.: US 8,924,821 B2
(45) Date of Patent: Dec. 30, 2014

(54) DECODING METHOD FOR LOW DENSITY PARITY CHECK AND ELECTRONIC DEVICE USING THE SAME

(71) Applicants: Novatek (Shanghai) Co., Ltd., Shanghai (CN); Novatek Microelectronics Corp., Hsinchu (TW)

(72) Inventors: Da-Wei Deng, Shanghai (CN); Dan Bao, Shanghai (CN); Zheng Li, Shanghai (CN); Song Qian, Shanghai (CN)

(73) Assignees: Novatek (Shanghai) Co., Ltd., Shanghai (CN); Novatek Microelectronics Corp., Hsinchu (TW)

( * ) Notice: Subject to any disclaimer, the term of this patent is extended or adjusted under 35 U.S.C. 154(b) by 165 days.

(21) Appl. No.: 13/772,365

(22) Filed: Feb. 21, 2013

(65) Prior Publication Data

US 2014/0173373 A1    Jun. 19, 2014

(30) Foreign Application Priority Data

Dec. 14, 2012 (CN) .......................... 2012 1 0544636

(51) Int. Cl.
*H03M 13/00*    (2006.01)
*H03M 13/11*    (2006.01)
(52) U.S. Cl.
CPC ................................ *H03M 13/1128* (2013.01)
USPC ......................................... 714/774; 714/758

(58) Field of Classification Search
CPC .......... H03M 13/255; H03M 13/2948; H03M 13/458
USPC ................................................... 714/774, 758
See application file for complete search history.

(56) References Cited

U.S. PATENT DOCUMENTS

| | | | |
|---|---|---|---|
| 6,901,119 B2* | 5/2005 | Cideciyan et al. ............ | 375/341 |
| 2007/0033482 A1* | 2/2007 | Seki .............................. | 714/758 |
| 2008/0052594 A1* | 2/2008 | Yedidia et al. ................ | 714/758 |
| 2008/0178066 A1* | 7/2008 | Kim et al. ..................... | 714/807 |
| 2009/0106625 A1* | 4/2009 | Jun et al. ....................... | 714/758 |
| 2009/0158128 A1* | 6/2009 | Yokokawa et al. ........... | 714/780 |

* cited by examiner

*Primary Examiner* — M. Mujtaba K Chaudry
(74) *Attorney, Agent, or Firm* — Jianq Chyun IP Office

(57) ABSTRACT

A decoding method for low density parity check (LDPC) and an electric device using the decoding method are provided. The decoding method includes: receiving a message and executing an iteration decoding to the message; obtaining first belief values of the message in an $(i-1)^{th}$ iteration; obtaining a first energy summation of the first belief values; obtaining second belief values of the message in an $i^{th}$ iteration; obtaining a second energy summation of the second belief values; determining whether the second energy summation is smaller than the first energy summation and whether a difference between the first energy summation and the second energy summation is larger than a first threshold; if yes, generating a decoding result according to the first belief values. Therefore, a bit error rate of the decoding is decreased.

8 Claims, 4 Drawing Sheets

Iteration decoding

DECODING METHOD FOR LOW DENSITY PARITY CHECK AND ELECTRONIC DEVICE USING THE SAME

CROSS-REFERENCE TO RELATED APPLICATION

This application claims the priority benefit of China application serial no. 201210544636.3, filed on Dec. 14, 2012. The entirety of the above-mentioned patent application is hereby incorporated by reference herein and made a part of this specification.

BACKGROUND

1. Technical Field

The invention relates to a decoding method. Particularly, the invention relates to a decoding method for low density parity check and an electronic device using the same.

2. Related Art

In a decoding process for low density parity check (LDPC), a decoding result is calculated through iteration. A real number calculated in the iteration process is stored in a plurality of bits. However, iteration times and the number of the bits (which is also referred to as bit width) are all limited. Generally, there are three reasons of error decoding. The first one is that a received message is severely damaged, and a decoding result of such message cannot be generated. The second one is that an upper limit of the iteration times is reached, so that the decoding result cannot be correctly generated. The third one is due to inadequate bit width, which leads to overflow and failure of decoding. If any of the above circumstance is occurred, a bit error rate of the decoding is increased.

Therefore, it is important to decrease the bit error rate in the decoding process of the LDPC.

SUMMARY

The invention is directed to a decoding method for low density parity check (LDPC) and an electronic device using the decoding method, by which a bit error rate of decoding is decreased.

An embodiment of the invention provides a decoding method for low density parity check (LDPC), which is adapted to an electronic device. The decoding method includes following steps. A message is received and an iteration decoding of the LDPC is executed to the message. A plurality of first belief values of the message are obtained in an $(i-1)^{th}$ iteration of the iteration decoding, where i is a positive integer greater than 1. A first energy summation of the first belief values is obtained. A plurality of second belief values of the message are obtained in an $i^{th}$ iteration of the iteration decoding. A second energy summation of the second belief values is obtained. It is determined whether the second energy summation is smaller than the first energy summation and whether a difference between the second energy summation and the first energy summation is greater than a first threshold. When the second energy summation is smaller than the first energy summation and the difference between the second energy summation and the first energy summation is greater than the first threshold, a decoding result of the message is generated according to the first belief values.

In an embodiment of the invention, the first energy summation is a sum of absolute values of the first belief values. The second energy summation is a sum of absolute values of the second belief values.

In an embodiment of the invention, before the step of determining whether the second energy summation is smaller than the first energy summation and whether the difference between the second energy summation and the first energy summation is greater than the first threshold, the method further includes determining whether the second belief values pass through a parity check of the LDPC, and generating the decoding result of the message according to the second belief values when the second belief values pass through the parity check.

In an embodiment of the invention, the decoding method further includes following steps. If the second energy summation is not smaller than the first energy summation or the difference between the second energy summation and the first energy summation is not greater than the first threshold, it is determined whether iteration times of the iteration decoding is greater than a second threshold. If the iteration times is greater than the second threshold, the iteration decoding is stopped, and the decoding result of the message is generated according to the second belief values.

According to another aspect, an embodiment of the invention provides an electronic device, which is used for decoding of low density parity check (LDPC). The electronic device includes a check circuit and an operation circuit. The operation circuit is used to receive a message, and executes an iteration decoding of the LDPC to the message. The operation circuit obtains a plurality of first belief values of the message in an $(i-1)^{th}$ iteration of the iteration decoding, where i is a positive integer greater than 1. The operation circuit obtains a plurality of second belief values of the message in an $i^{th}$ iteration of the iteration decoding. The check circuit obtains a first energy summation of the first belief values, and obtains a second energy summation of the second belief values. The check circuit determines whether the second energy summation is smaller than the first energy summation and whether a difference between the second energy summation and the first energy summation is greater than a first threshold. When the second energy summation is smaller than the first energy summation and the difference between the second energy summation and the first energy summation is greater than the first threshold, the operation circuit generates a decoding result of the message according to the first belief values.

In an embodiment of the invention, the check circuit further determines whether the second belief values pass through a parity check of the LDPC. When the second belief values pass through the parity check, the operation circuit generates the decoding result of the message according to the second belief values.

In an embodiment of the invention, if the second energy summation is not smaller than the first energy summation or the difference between the second energy summation and the first energy summation is not greater than the first threshold, the check circuit determines whether iteration times of the iteration decoding is greater than a second threshold. If the iteration times is greater than the second threshold, the operation circuit stops the iteration decoding, and generates the decoding result of the message according to the second belief values.

According to the above descriptions, by using the decoding method for LDPC and the electronic device using the same, the iteration decoding is stopped early, so as to decrease a bit error rate.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
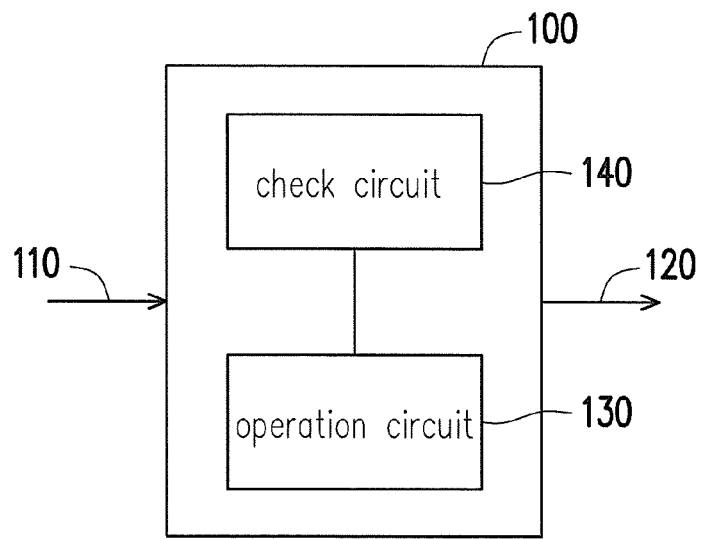
FIG. 1 is a block diagram of an electronic device according to an embodiment of the invention.

FIG. 1 is a block diagram of an electronic device according to an embodiment of the invention.

Referring to FIG. 1, the electronic device 100 receives a message 110, and executes a decoding method of low density parity check (LDPC) to the message 110, and finally outputs a decoding result 120. The electronic device 100 can be implemented as a computer, a server, a communication device or any form of embedded system, which is not limited by the invention.

The electronic device 100 includes an operation circuit 130 and a check circuit 140. The check circuit 140 is coupled to the operation circuit. The operation circuit 130 is used to execute an iteration decoding of the LDPC to the message 110. The check circuit 140 determines lines whether to stop the iteration decoding. If the check circuit 140 determines to stop the iteration decoding, the operation circuit 130 stops the iteration decoding and generates the decoding result 120.

Figure 2:
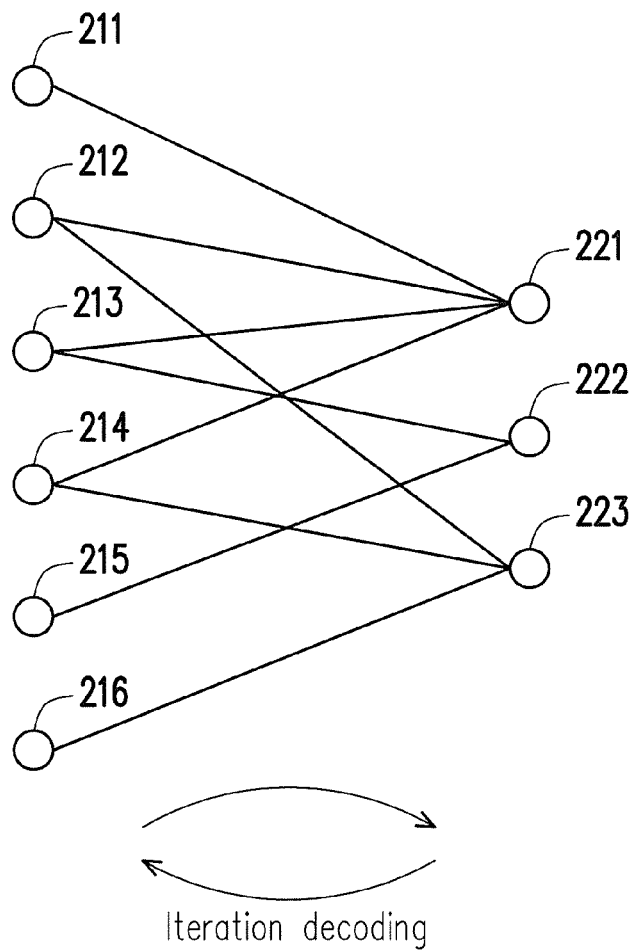
FIG. 2 is a schematic diagram of an iteration decoding according to an embodiment of the invention.

FIG. 2 is a schematic diagram of iteration decoding according to an embodiment of the invention.

Referring to FIG. 2, it is assumed that the message 110 includes 6 message bits, in which 3 message bits are data bits, and the other 3 message bits are check bits. The check bits are used to check whether the data bits are correct. The 6 message bits can be represented as message nodes 211-216, and check expressions corresponding to the 3 check bits can be represented as check nodes 221-223. Connection lines between the message nodes 211-216 and the check nodes 221-223 represent message bits to be checked by each of the check expressions. For example, the check node 222 is connected to the message nodes 213 and 215, which represents that a remainder of a sum of the message bits corresponding to the message node 213 and the message node 215 divided by 2 is 0.

In an embodiment, the connection lines between the message nodes 211-216 and the check nodes 221-223 can be represented as a check matrix. In the embodiment of FIG. 2, a dimension of the check matrix is 3-by-6. Moreover, the 6 message bits can be represented as a vector. If a multiplication of the check matrix and a vector composed of the message bits (a dimension thereof is 6-by-1) is a zero vector, it represents that a result calculated by each of the check expressions is 0, and theses message bits are taken as a decoding result. The operation of multiplying the check matrix by the vector is referred to as parity check. If a multiplication result of the check matrix and the vector is the zero vector, it represents that it passes through the parity check. However, in other embodiments, the message 110 may include more or less number of message bits, which is not limited by the invention. Content of the check matrix and number of the check bits are also not limited by the invention.

In each iteration of the iteration decoding, the message nodes 211-216 transmit a plurality of probability values to the check nodes 221-223, and the check nodes 221-223 transmit back a plurality of probability values to the message nodes 211-216. Each of the probability values represents a probability that one message bit is correctly decoded as "0" or "1". Therefore, the process of the iteration decoding can also be referred to as belief propagation. After the check nodes 221-223 transmit back the probability values to the message nodes 211-216, these probability values are used to generate a plurality of belief values. Each of the message bits (i.e. the message nodes 211-216) corresponds to one belief value. A magnitude of the belief value is used to determine whether one message bit is decoded as "0" or "1". For example, if one belief value is greater than or equal to 0, the message bit corresponding to the belief value is decoded as "0", otherwise, the message bit is decoded as "1". The iteration decoding may use a sum-product algorithm, a min-sum algorithm or other suitable algorithms. Those skilled in the art can calculate the probability values and the belief values according to the algorithms, which is not repeated.

During the process of iteration decoding, the belief value generated through each iteration should be more and more polarized (i.e. more and more larger or more and more smaller). However, one belief value is presented by a plurality of bits. When the belief value is too large or too smaller, a problem of overflow is probably occurred, and correct decoding cannot be implemented. In the present embodiment, the electronic device 100 can detect the overflow, and decrease a bit error rate.

Figure 3:
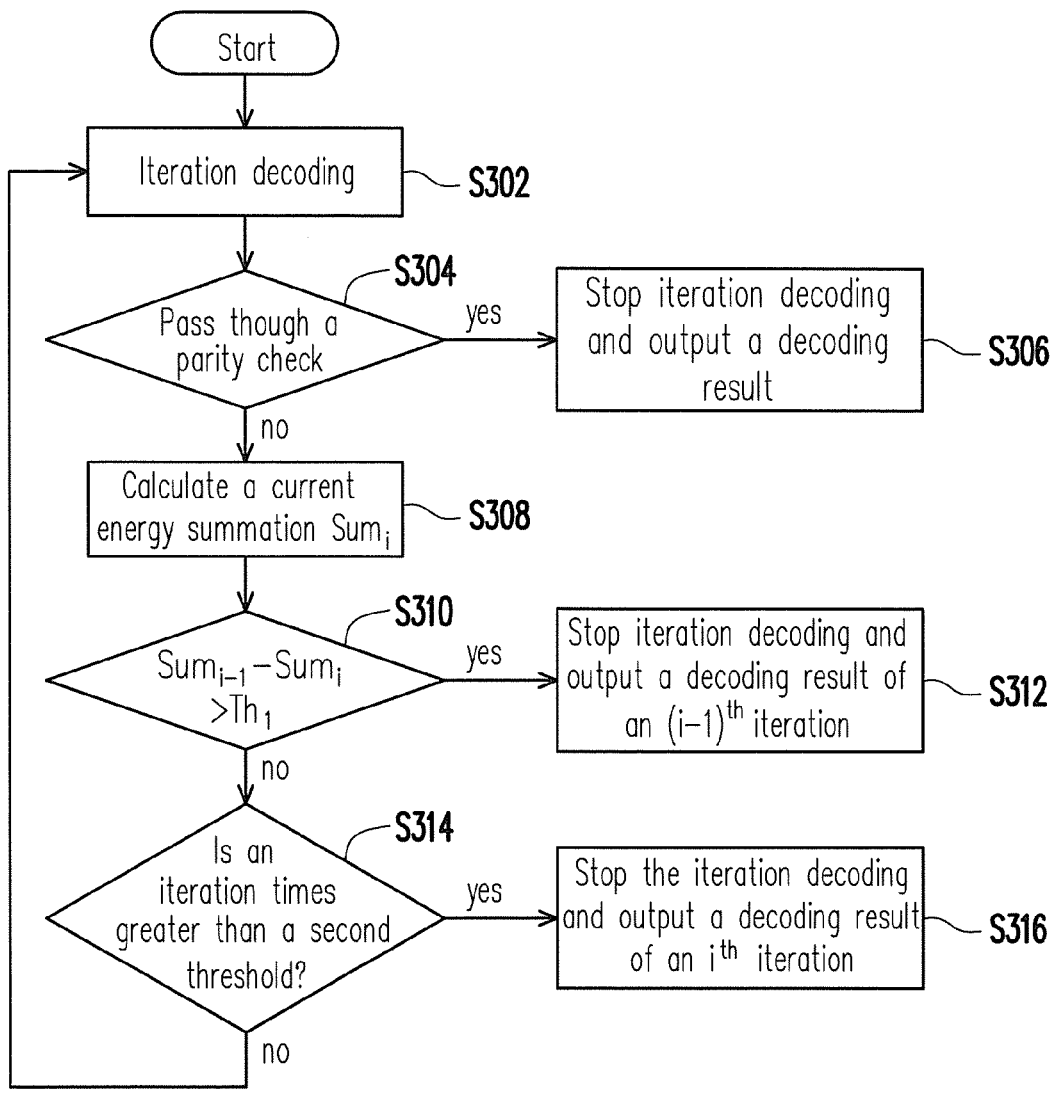
FIG. 3 is a flowchart illustrating an operation of the electronic device 100 according to an embodiment of the invention.

FIG. 3 is a flowchart illustrating an operation of the electronic device 100 according to an embodiment of the invention.

Referring to FIG. 3, in step S302, the operation circuit 130 executes the iteration decoding to the received message 110. In each of the iterations, the operation circuit 130 generates a plurality of belief values of the message.

In step S304, the check circuit 140 determines whether the belief values pass through the parity check of LDPC. For example, the check circuit 140 generates a plurality of message bits according to magnitudes of the belief values, and multiplies the check matrix and a vector composed of the message bits. If a multiplication result of the check matrix and the vector is a zero vector, the check circuit 140 determines that the belief values have passed through the parity check.

If the result of the step 304 is "affirmative", in step S306, the operation circuit 130 stops the iteration decoding and outputs the decoding result. For example, the operation circuit 130 determines to decode each of the message bits in the message 110 to be "0" or "1" according to magnitudes of the belief values, so as to generate the decoding result.

If the result of the step 304 is "negative", in step S308, the check circuit 140 calculate a current (an $i^{th}$ iteration, where i is a positive integer greater than 1) energy summation $Sum_i$. For example, the check circuit 140 obtains an absolute value of each of the belief values, and calculate a sum of the absolute values (i.e. energy summation). The greater the absolute value of a belief value is, the greater the energy of the belief value is. In the general iteration decoding, the belief values should be more and more polarized, i.e. the energy summation becomes greater. However, in other embodiments, the check circuit 140 can also take a sum of squares of the belief values as the energy summation, and calculation of the energy summation is not limited by the invention. Here, in a previous iteration (an $(i-1)^{th}$ iteration), the step S308 is executed to calculate an energy summation $Sum_{i-1}$.

In step S310, the check circuit 140 determines whether the current energy summation $Sum_i$ is smaller than the energy summation $Sum_{i-1}$ generated in the previous iteration, and whether a difference between the energy summation $Sum_i$ and the energy summation $Sum_{i-1}$ is greater than a first threshold $Th_1$. For example, in the present embodiment, the check circuit 140 determines whether a value obtained by subtracting the energy summation $Sum_i$ from the energy summation $Sum_{i-1}$ is greater than the first threshold $TH_1$, where the first threshold is a positive number. If a result of the step S310 is "affirmative", it represents that the energy summation suddenly drops, which probably has the problem of overflow.

Therefore, if the result of the step S310 is "affirmative", in step S312, the operation circuit 130 stops the iteration decoding, and outputs a decoding result of the $(i-1)^{th}$ iteration. Namely, the operation circuit 130 determines whether each message bit is decoded as "0" or "1" according to a magnitude of the belief value generated according to the $(i-1)^{th}$ iteration, so as to generate the decoding result.

If the result of the step S310 is "negative", a step S314 is executed, by which the check circuit 140 determines whether the iteration times of the iteration decoding is greater than a second threshold.

If a result of the step S314 is "affirmative", a step S316 is executed, by which the check circuit 140 stops the iteration decoding and outputs a decoding result of the $i^{th}$ iteration. Namely, the operation circuit 130 determines whether each message bit is decoded as "0" or "1" according to a magnitude of the belief value generated according to the $i^{th}$ iteration, so as to generate the decoding result.

If the result of the step S314 is "negative", the electronic device 100 returns to the step S302 to perform a next iteration.

Figure 4:
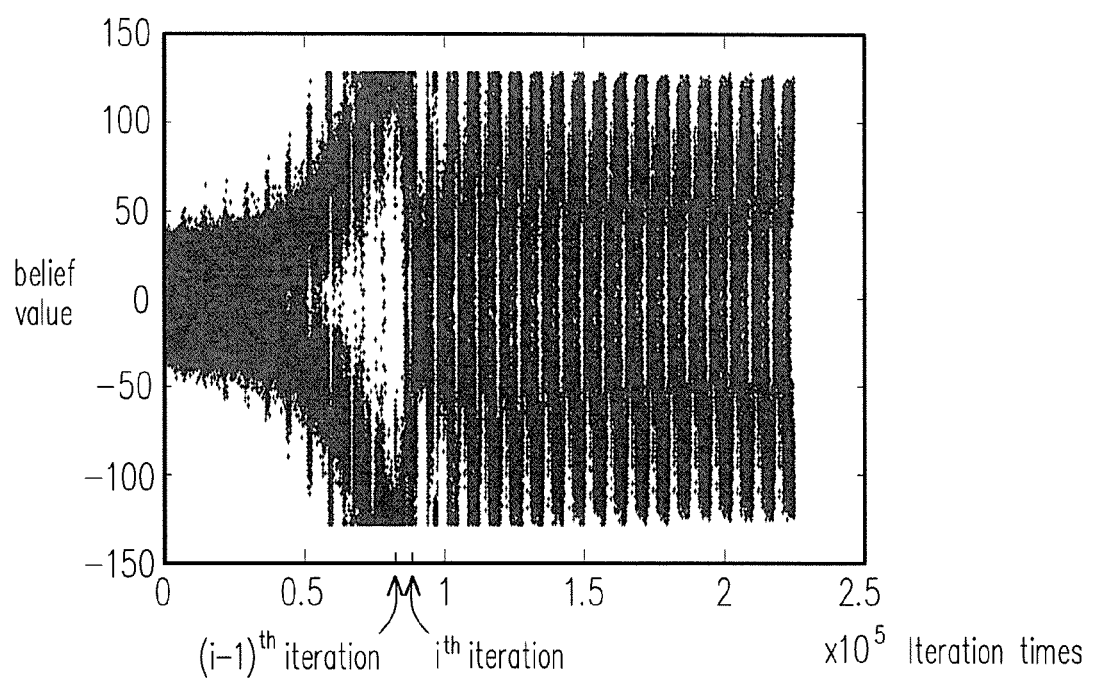
FIG. 4 is a schematic diagram of stopping an iteration decoding early according to an embodiment of the invention.

FIG. 4 is a schematic diagram of stopping the iteration decoding early according to an embodiment of the invention.

Referring to FIG. 4, a horizontal axis represents the iteration times, and a vertical axis represents belief values. It should be noticed that each of the belief values of the present embodiment is stored in the electronic device 100 in 7 bits. Therefore, each of the belief values is not greater than 128 and is not less than −128. However, in other embodiments, each of the belief values can be stored in more or less number of bits, which is not limited by the invention. Before the $(i-1)^{th}$ iteration, the generated belief values are gradually polarized, and the more the belief value is polarized, the higher probability that the decoded message bit is correct. In the $(i-1)^{th}$ iteration, most of the belief values are far greater than 0 or far less than 0. In the $i^{th}$ iteration, a part of the belief values is close to 0 due to the overflow. Therefore, the energy summation of the $(i-1)^{th}$ iteration is far greater than the energy summation of the $i^{th}$ iteration. In the present embodiment, the operation circuit 130 outputs the decoding result of the $(i-1)^{th}$ iteration according to the method shown in FIG. 3, so as to decrease the bit error rate.

Figure 5:
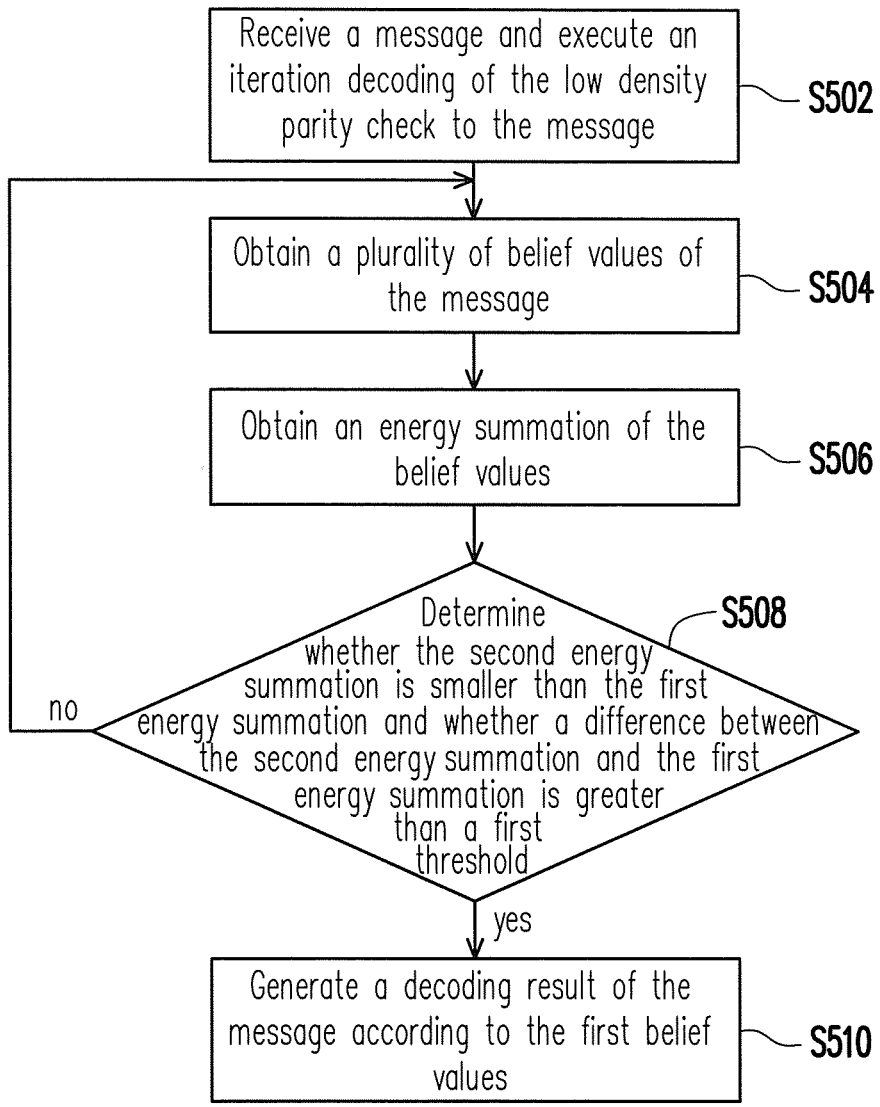
FIG. 5 is a flowchart illustrating a decoding method for low density parity check (LDPC) according to an embodiment of the invention.

FIG. 5 is a flowchart illustrating a decoding method for LDPC according to an embodiment of the invention.

Referring to FIG. 5, in an embodiment, the steps of FIG. 5 can be implemented by a plurality of instructions. These instructions are stored in a memory, and are executed by a processor. Alternatively, in another embodiment, the steps of FIG. 5 can be implemented by one or a plurality of circuits, and the invention does not limit to implement the steps of FIG. 5 through a software manner or a hardware manner.

In step S502, a message is received, and an iteration decoding of LDPC is performed to the message.

In step S504, a plurality of belief values of the message are obtained. The belief values generated in the $(i-1)^{th}$ iteration is referred to as first belief values, and the belief values generated in the $i^{th}$ iteration is referred to as second belief values.

In step S506, an energy summation of the belief values is obtained, where the energy summation of the first belief values is referred to as a first energy summation, and the energy summation of the second belief values is referred to as a second energy summation.

In step S508, it is determined whether the second energy summation is smaller than the first energy summation, and whether a difference between the second energy summation and the first energy summation is greater than a first threshold. If a result of the step S508 is "affirmative", a step S510 is executed. If the result of the step S508 is "negative", it is returned to the step S504.

In the step S510, a decoding result of the message is generated according to the first belief values.

Various steps of FIG. 5 have been described above, which are not repeated.

In summary, in the decoding method and the electronic device using the same, it is determined whether the energy summation of the belief values suddenly drops in each iteration. If the energy summation suddenly drops, it represents the overflow is probably occurred, and the decoding result of the previous iteration is output. In this way, the bit error rate is decreased.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A decoding method for low density parity check, adapted to an electronic device, and the decoding method comprising:
   receiving a message and executing an iteration decoding of the low density parity check to the message;
   obtaining a plurality of first belief values of the message in an $(i-1)^{th}$ iteration of the iteration decoding, wherein i is a positive integer greater than 1;
   obtaining a first energy summation of the first belief values;
   obtaining a plurality of second belief values of the message in an $i^{th}$ iteration of the iteration decoding;
   obtaining a second energy summation of the second belief values;
   determining whether the second energy summation is smaller than the first energy summation and whether a difference between the second energy summation and the first energy summation is greater than a first threshold; and
   generating a decoding result of the message according to the first belief values when the second energy summation is smaller than the first energy summation and the difference between the second energy summation and the first energy summation is greater than the first threshold.

2. The decoding method for low density parity check as claimed in claim 1, wherein the first energy summation is a sum of absolute values of the first belief values, and the second energy summation is a sum of absolute values of the second belief values.

3. The decoding method for low density parity check as claimed in claim 1, wherein before the step of determining whether the second energy summation is smaller than the first energy summation and whether the difference between the second energy summation and the first energy summation is greater than the first threshold, the method further comprises:
- determining whether the second belief values pass through a parity check of the low density parity check; and
- generating the decoding result of the message according to the second belief values when the second belief values pass through the parity check.

4. The decoding method for low density parity check as claimed in claim 1, further comprising:
- determining whether iteration times of the iteration decoding is greater than a second threshold when the second energy summation is not smaller than the first energy summation or the difference between the second energy summation and the first energy summation is not greater than the first threshold; and
- stopping the iteration decoding when the iteration times is greater than the second threshold, and generating the decoding result of the message according to the second belief values.

5. An electronic device, used for decoding of low density parity check, and comprising:
- a check circuit; and
- an operation circuit, coupled to the check circuit,
- wherein the operation circuit receives a message, and executes an iteration decoding of the low density parity check to the message,
- the operation circuit obtains a plurality of first belief values of the message in an $(i-1)^{th}$ iteration of the iteration decoding, wherein i is a positive integer greater than 1,
- the operation circuit obtains a plurality of second belief values of the message in an $i^{th}$ iteration of the iteration decoding,
- wherein the check circuit obtains a first energy summation of the first belief values, and obtains a second energy summation of the second belief values,
- wherein the check circuit determines whether the second energy summation is smaller than the first energy summation and whether a difference between the second energy summation and the first energy summation is greater than a first threshold,
- when the second energy summation is smaller than the first energy summation and the difference between the second energy summation and the first energy summation is greater than the first threshold, the operation circuit generates a decoding result of the message according to the first belief values.

6. The electronic device as claimed in claim 5, wherein the first energy summation is a sum of absolute values of the first belief values, and the second energy summation is a sum of absolute values of the second belief values.

7. The electronic device as claimed in claim 5, wherein the check circuit further determines whether the second belief values pass through a parity check of the low density parity check,
- when the second belief values pass through the parity check, the operation circuit generates the decoding result of the message according to the second belief values.

8. The electronic device as claimed in claim 7, wherein when the second energy summation is not smaller than the first energy summation or the difference between the second energy summation and the first energy summation is not greater than the first threshold, the check circuit determines whether iteration times of the iteration decoding is greater than a second threshold,
- when the iteration times is greater than the second threshold, the operation circuit stops the iteration decoding, and generates the decoding result of the message according to the second belief values.

\* \* \* \* \*